United States Patent [19]

Sharma

[11] Patent Number: 4,677,393
[45] Date of Patent: Jun. 30, 1987

[54] PHASE-CORRECTED WAVEGUIDE POWER COMBINER/SPLITTER AND POWER AMPLIFIER

[75] Inventor: Arvind K. Sharma, Mercer County, N.J.

[73] Assignee: RCA Corporation, Princeton, N.J.

[21] Appl. No.: 789,750

[22] Filed: Oct. 21, 1985

[51] Int. Cl.$^4$ .............................................. H03F 3/60
[52] U.S. Cl. .................................... 330/286; 330/295; 333/137
[58] Field of Search ................. 330/56, 286, 287, 295; 333/100, 103, 125, 137; 343/785, 837, 840

[56] References Cited

U.S. PATENT DOCUMENTS

| | | | |
|---|---|---|---|
| 3,008,141 | 11/1961 | Cohn et al. | 343/772 |
| 3,573,835 | 4/1971 | Stark | 343/776 |
| 4,282,491 | 8/1981 | MacMaster et al. | 330/286 |
| 4,291,278 | 9/1981 | Quine | 330/286 |
| 4,329,692 | 5/1982 | Brunner | 343/780 |
| 4,349,827 | 9/1982 | Bixler et al. | 343/840 X |
| 4,424,496 | 1/1984 | Nichols et al. | 330/286 |
| 4,588,962 | 5/1986 | Saito et al. | 330/286 |

Primary Examiner—James B. Mullins
Attorney, Agent, or Firm—Joseph S. Tripoli; William H. Meise; Henry I. Steckler

[57] ABSTRACT

A waveguide power combiner or splitter (divider) includes a common waveguide having an axis skewed relative to the axes of a line array waveguides. A sectoral parabolic reflector is oriented with its focus at a port of the common waveguide with its axis parallel with the axes of the waveguides of the array for reflecting signals from the focal point to create a locus of constant phase at the ports of the waveguide array, whereby signal power originating at the common waveguide is divided equally among the waveguides of the waveguide array. A waveguide power amplifier includes a power splitter as described above, and an amplifier module located in each waveguide of the waveguide array to amplify the power therein to produce amplified signal in an output waveguide array. The amplified signals from the amplifier modules are combined by a second reflector driven by the output waveguide array and reflected to a common output port.

16 Claims, 18 Drawing Figures

PHASE-CORRECTED WAVEGUIDE POWER COMBINER/SPLITTER AND POWER AMPLIFIER

This invention relates to waveguide power splitters and combiners and to amplifiers using waveguide power splitters and power combiners in conjunction with amplifier modules.

BACKGROUND OF THE INVENTION

Earth satellites are finding increasing use as transponders for communications systems. The use of satellites for communication links between cities eliminates the need for land communication cables, which are very costly. In order to provide continuous coverage, a satellite must be in a geosynchronous orbit. Such orbits require that the satellite be at an altitude of about 22,000 miles. Thus, communications by way of a geosynchronous satellite requires transmission over a path length of 22,000 miles to the satellite and transmission from the satellite over a 22,000 mile path length to the receiving Earth station. Effective transmission over such a distance requires relatively high antenna gain. The necessary gain is achievable with antennas of reasonable size and reasonable cost only at microwave frequencies and at frequencies higher than microwave (hereinafter referred to simply as microwave).

The transmission of signal from the satellite to the Earth station requires a power amplifier located in the satellite capable of generating tens or hundreds of watts of microwave power with great reliability. In the past, the microwave power was generated by travelling wave tubes (TWT). Travelling wave tubes were, and continue to be, used for satellite transmitters notwithstanding the reliability problem attributable to the inherent degradation resulting from operation of a heated cathode over a period of time. More recently, solid state power amplifiers (SSPA) have been used at lower microwave frequencies, such as at C-band, instead of travelling wave tubes. The SSPA has no inherent degradation mechanism, so is more reliable than the TWT. A need exists to provide solid state power amplifiers at X-band (around 10 GHz) and at millimeter wave frequencies (as, for example, 30 GHz).

Solid state power amplifiers are implemented by using a large number of relatively low power solid state devices. Each solid state device provides a small portion of the total output power, and power combiners are used to combine the powers from each of the individual solid state devices to generate the desired amount of signal power at microwave or millimeter wave frequencies.

Various types of power combiners are described in the article "Microwave Power Combining Techniques" by Kenneth J. Russell, published in the IEEE Transaction Microwave Theory and Techniques, May 1979. In the Russell article, corporate or tree combiners are described as being useful for combining a small number of devices but as being very inefficient as the number of devices combined increases. Similarly, the chain type of combiner is not useful. Russell also describes resonant and nonresonant N-way combiners. Among the more successful techniques which he described for combining power are the cavity combining technique. However, this technique has limited bandwidth.

One problem associated with SSPA amplifiers for satellite applications is that of heat dissipation. Water cooling is not practical in a space environment, and there is little or no atmosphere to provide convection cooling. As a practical matter, all cooling of the amplifier modules of an SSPA for space use must be accomplished by conduction. It is a complex problem to make a broadband SSPA which is reliable, small, and in which the heat dissipated by the active elements is carried away by conduction.

U.S Pat. No. 4,291,278 issued Dec. 22, 1981, to Quine describes a power amplifier including a feed waveguide, a fin-line array transition from waveguide to microstrip, a plurality of amplifiers each of which is fed from microstrip, a plurality of phase shifters at the output of the amplifiers for compensating phase, and a fin-line array transition from microstrip to waveguide. This structure requires a phase compensator for each amplifier in order to compensate for the different path lengths from the common feed point to each amplifier, and has the additional problem of requiring alignment of the phase compensators. Furthermore, each phase compensator presumably has a different loss and this results in combination of unequal powers. As the number of amplifiers increases from a few to a very large number, the length of the transmission lines to and from the amplifier most remote from the feed point tends to reduce the effectiveness of the structure in combining the power.

A power amplifier is desired which is easy to manufacture and suitable for use at microwave and millimeter wave frequencies, does not require phase correction for differing line lengths, in which each amplifier module may be provided with positive heat sinking, and each module can be accessed for maintenance without substantial disassembly of the structure.

SUMMARY OF THE INVENTION

A waveguide combiner/divider includes a conductive reflector having a focal point. A waveguide feed is located at the focal point and is arranged for illuminating the reflector. A plurality of waveguides, each of which includes at least one aperture, is arrayed before the reflector for transferring electromagnetic energy between the waveguide feed and the array of waveguides by way of the reflector. A conductive shielding and support arrangement is coupled to the reflector, to the waveguide feed, and to the array of waveguides to enclose a region for constraining the electromagnetic energy to the waveguide feed, the plurality of waveguides, and to a region between the reflector, the waveguide feed and the plurality of waveguides. In a particular embodiment of the invention, the reflector has a shape defined by a section of a parabola and the waveguide array has its apertures in a line and oriented so that the phase of the energy at the apertures of the array of waveguides is constant.

A power amplifier includes two such combiner/divider structures, one for splitting the signal to be amplified into a number of waveguides, and the other for combining the amplified signals from the waveguides. Each waveguide includes a power amplifier module.

DESCRIPTION OF THE INVENTION

Figure 1:
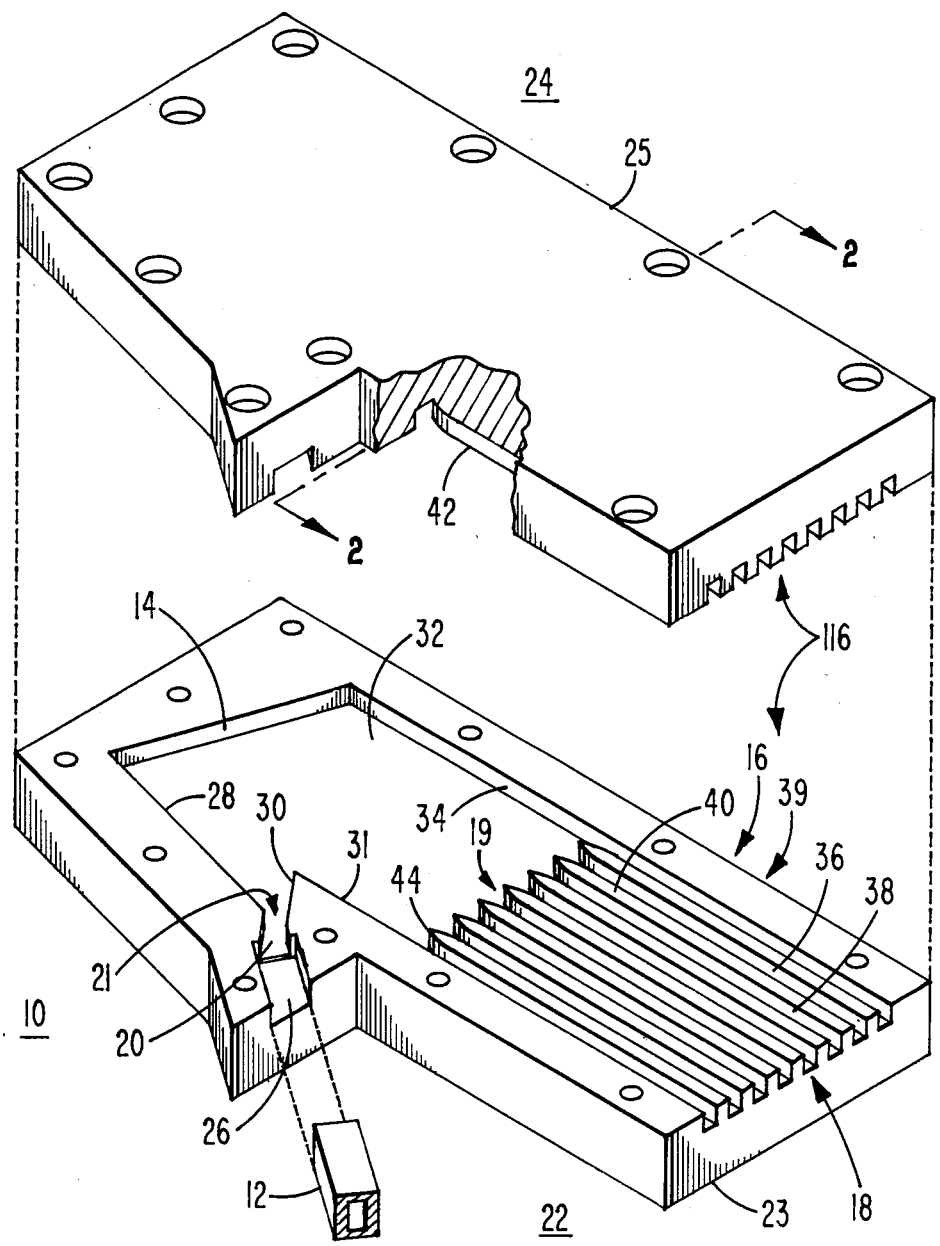
FIG. 1 is a perspective view, exploded and partially cut away, of two halves of a waveguide power combiner/splitter according to the invention.
Figure 2:
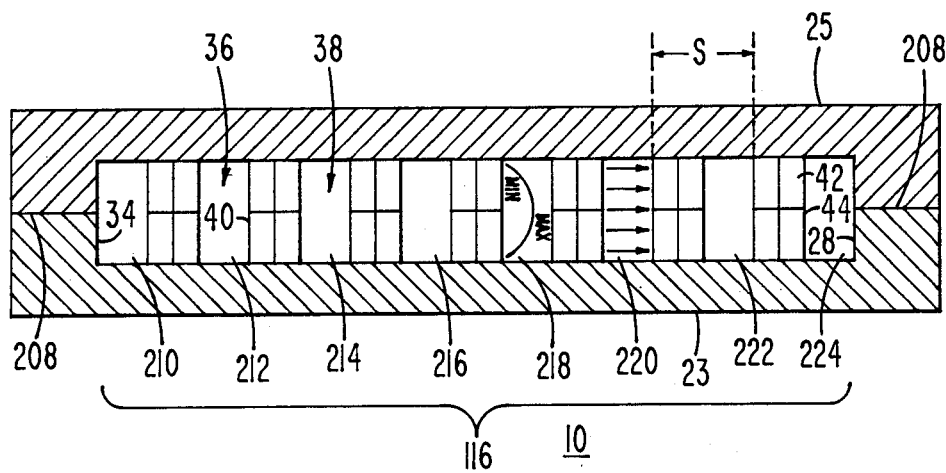
FIG. 2 is a cross-sectional view of the arrangement of FIG. 1 in its assembled form.

FIG. 1 illustrates an exploded view of a power combiner or power splitter 10 according to the invention, and FIG. 2 is a cross sectional view of the unit 10 in the assembled condition. In general, the arrangement of FIGS. 1 and 2 accepts microwave signals from a waveguide 12 and propagates microwave signals by an E-plane pill-box structure to a curved reflector surface 14 which reflects the signals towards an array of waveguides partially defined by an array of slots 16 in lower half 22 and partially by the corresponding array of slots in upper half 24. The input signal applied through waveguide 12 appears at output ports 18 of the array of waveguides. As illustrated in FIG. 1, there are eight waveguides and eight output apertures or ports 18. In a preferred embodiment of the invention, reflector 14 is a sector of a parabola having its focus at a point 20 near waveguide input port 21, and reflects the energy in such a manner that the signals arriving at each of the waveguide output ports of array of output ports 18 is substantially uniform in magnitude and of equal phase. As is well known to those skilled in the art, the operations of power splitting and power combining are reciprocal, so that microwave signals of equal amplitude and phase when applied to array of waveguide output ports 18 will combine and exit through waveguide 12.

As illustrated in FIG. 1, power combiner/splitter 10 is formed from two mating halves 22 and 24. Halves 22 and 24 are milled from conductive plates 23 and 25, respectively. These portions are merely reflections of each other about a parting plane 208 (FIG. 2), so only portion 22 will be described in detail. Conductive bottom plate 23 is basically a flat plate milled in a region 26 to accommodate the outer dimensions of waveguide 12, and is necked in the region of focal point 20 to the inner dimensions of waveguide 12. When assembled, plates 23 and 25 envelop waveguide 12. Walls 28 and 30, and a portion of floor 32, together with the corresponding portions of upper half 24 form a closed E-plane horn of a type known as a sectoral horn which, in power splitter operation, distributes the microwave energy applied through waveguide 12 to focal point 20 across reflector 14, thereby illuminating the reflector. Due to the aforementioned reciprocity of combining and splitting, the term illumination applies regardless to the direction of signal flow. As described below, reflector 14 is shaped and oriented so as to reflect energy emanating from focal point 20 parallel with a wall 34 towards the array of ports 19 of the waveguide array, which is designated 116. The use of an E-plane horn reduces losses on the signal passing therethrough and allows the waveguide array to be arrayed in the E-plane, thereby minimizing the large dimension of the apparatus.

As illustrated in FIG. 1, waveguide array 116 is defined by 8 slots 16 milled in lower plate 23 (and the corresponding slots in upper plate 25). One of the slots is designated 36. There are eight slots 16 which are milled at equal distances from each other to define seven septums, designated generally as 39. For example, slots 36 and 38 define a septum 40 having a finite thickness. A cut away portion of upper plate 24 reveals a septum 42 which matches a septum 44 of lower half plate 22. The end of septums 39 nearest reflector 14 are tapered in thickness to form points, in order to provide a more gradual transition for the energy entering waveguide array 116 from reflector 14. In a preferred embodiment of the invention, milled slots 16 are separated from each other by a distance established by the thickness of the septums 39, which is selected to provide a unit separation or spacing of the waveguides 116 ranging from one wavelength ($\lambda$) to one-half wavelength ($\lambda/2$) at the frequency of operation. For this purpose, unit spacing is the distance between a point on a waveguide and a corresponding point on an adjacent waveguide, and is similar in concept to the length of one cycle of the array.

It is readily seen that walls 14, 28, 30, 32, 34 and the corresponding walls of the upper half 24 form a closed conductive cavity which prevents energy from entering or leaving except by way of waveguide ports 19.

FIG. 2 is a cross section of power combiner/splitter 10 in its assembled state, taken along the section lines 2—2 of FIG. 1 looking into ports 19. Elements of FIG. 2 corresponding to those of FIG. 1 are designated by the same reference numerals. In FIG. 2, a line 208 extending from left to right is the parting plane between lower plate 23 and upper plate 25. The tapered portions of septum 42 and septum 44 of the upper and lower halves, respectively, appear at the right of FIG. 2. Slots 36 and 38 which define septum portion 40 are also illustrated. Slot 36 when mated with the corresponding slots in upper half 24 defines a waveguide 212, and similarly slot 38 formed in lower half 22 when mated with a corresponding slot in upper half 24 forms a waveguide 214. The eight individual waveguides of waveguide array 116 are designated 210-224 and are arrayed with contiguous broad walls. Arrows illustrated within waveguide 220 indicate an instantaneous direction of the electric field, and a curve illustrated within waveguide 218 shows that the maximum electric field intensity occurs midway between the narrow walls of each waveguide and the minimum field intensity occurs at each narrow wall, because the electrical field cannot exist parallel to a conductive surface. The unit-to-unit spacing or unit spacing of the waveguides is illustrated by the distance S between the rightmost walls of waveguides 220 and 222.

Figure 3:
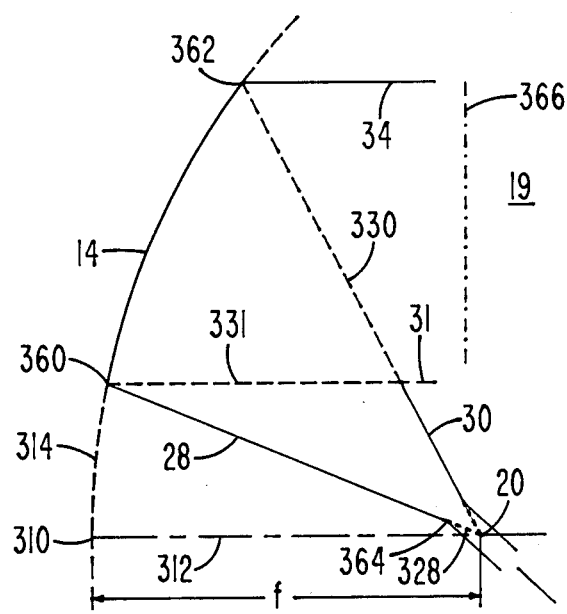
FIG. 3 defines the curvature of the reflector which is part of the arrangement of FIG. 1 and illustrates some ray paths.

FIG. 3 is a schematic diagram illustrating the characteristic and position of reflector 14 relative to the surrounding walls. As illustrated, reflector 14 is in the shape of a truncated paraboloid or of a sector of a parabola 314 having a vertex at a point 310 and a focus at point 20. Vertex 310 and focus 20 define a longitudinal axis 312. Walls 31 and 34 are parallel to axis 312. Dashed line 331 is the projection of wall 31, which intersects parabola 314 at a point 360, and wall 34 intersects parabola 314 at a point 362. Reflector 14 has the shape of parabola 314 in the region between points 360 and 362. Wall 28 follows a path from point 360 to a point 364 which is along a line 328 lying between points 20 and 360. Similarly, wall 30 lies along a line 330 extending between focal point 20 and the other end 362 of reflector 14. Parabolic reflector 14 reflects energy arriving from focus 20 in a direction parallel with axis 312 and with walls 31 and 34 to arrive at waveguide ports 19. Waveguide ports 19 lie along a line 366 which is perpendicular to axis 312. As is known in the art, a wavefront of constant phase arrives at ports 19 as a result of energy radiated from focus 20.

Figure 4:
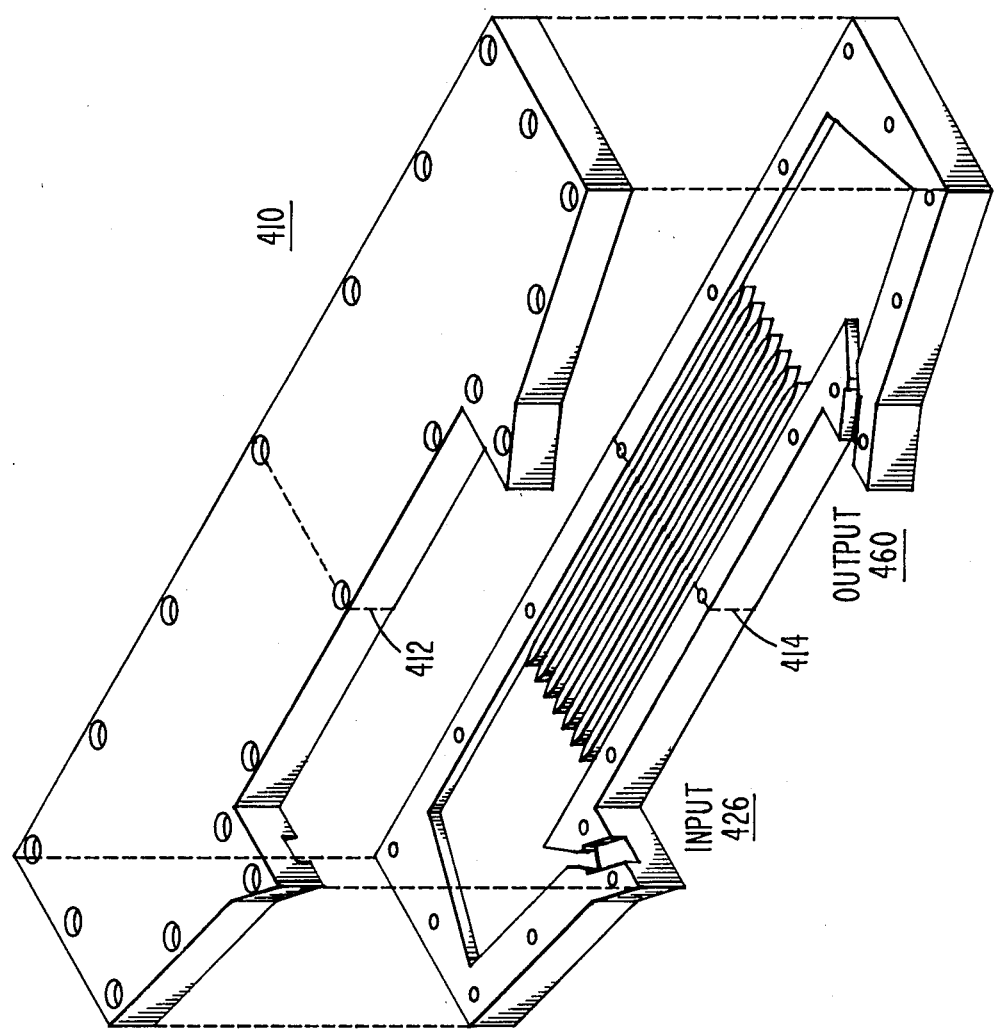
FIG. 4 illustrates a pair of power combiners/splitters similar to that of FIG. 1 connected together so as to have but a single input and a single output port.
Figure 5:
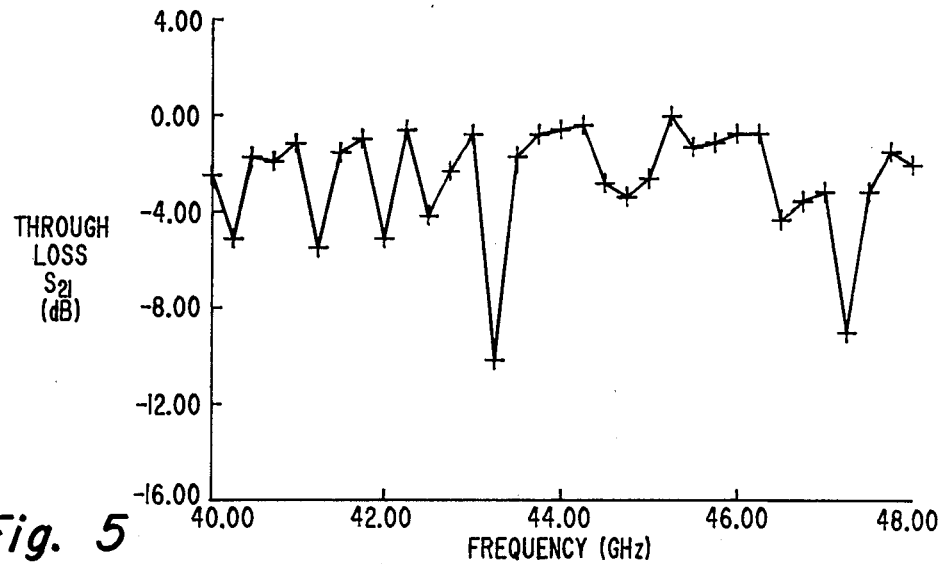
FIG. 5 is a plot of through loss versus frequency for a power combiner/splitter arranged as in FIG. 4.

FIG. 4 illustrates two combiners/splitters similar to that of FIG. 1 connected together along imaginary parting lines 412, 414. The parting lines define a connection of the power combiners/splitters by means of the ports 18 of the array 116 of eight waveguides. An input waveguide port 426 and an output waveguide port 460 are identified, although those skilled in the art will realize that they may be interchanged. A structure such as that illustrated in FIG. 4 is convenient for measuring the characteristics of a combiner/splitter such as that of FIG. 1. For example, the through loss of the combiner/splitter of FIG. 1 is exactly one half the through loss of the arrangement of FIG. 4. FIG. 5 is a plot of the loss of a single combiner/splitter such as that of FIG. 2 as established by measurements made on a dual arrangement such as that of FIG. 4 optimized for operation at 44 GHz, and having dimensions as in the following table:

Feed Waveguide Type WR22 "Q band", inside dimension
  0.224×0.112 inch
  5.69×2.85 mm
Each waveguide of Waveguide Array, inside dimension
  0.224×0.112 inch
  5.69×2.85 mm
Taper length of each septum
  0.200 inch
  5.08 mm.
Unit spacing of waveguides of waveguide array
  0.192 inch
  4.8768 mm.

Figure 6:
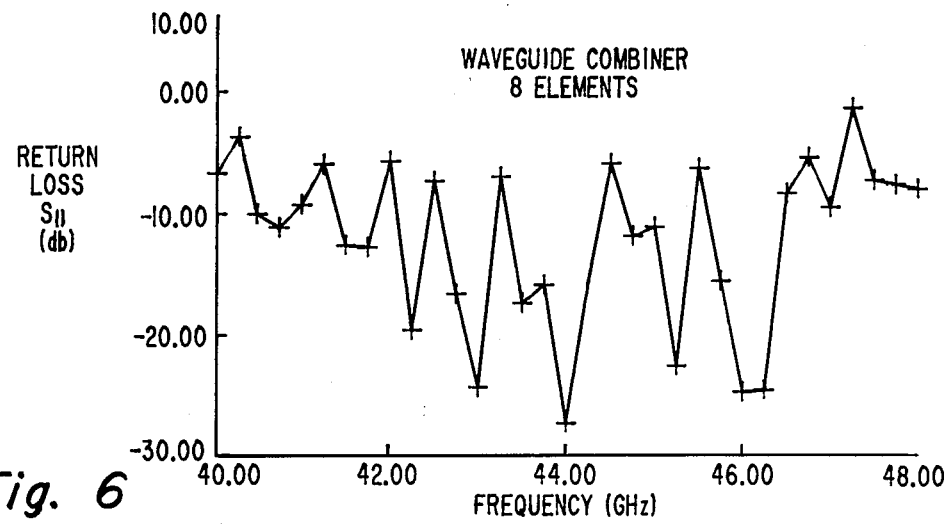
FIG. 6 is a plot of return loss versus frequency for the arrangement of FIG. 4, illustrating the existence of mismatches.
Figure 7:
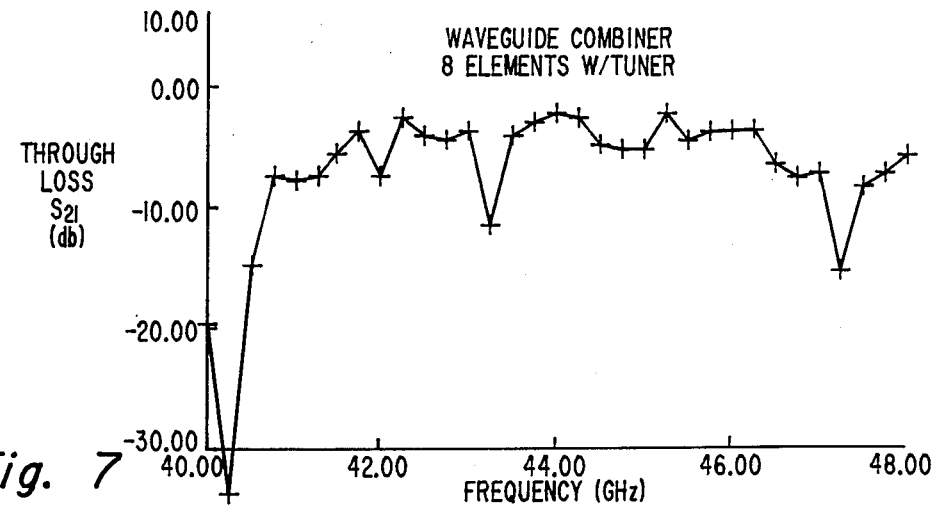
FIG. 7 is a plot of through loss versus frequency for a power combiner/splitter arranged as in FIG. 4, with mismatches tuned.

As can be seen from FIG. 5, the loss at the design center frequency of 44 GHz is less than 1.34 db. The losses vary somewhat at other frequencies. FIG. 6 is a plot of return loss versus frequency. The return loss is an indication of the impedance which the combiner/splitter present to its input port. As illustrated in FIG. 6, the return loss is nearly 30 db at 44 GHz, (indicative of good impedance match) and less than 10 db at certain other frequencies (indicative of a mismatch). FIG. 7 illustrates the through loss of the same combiner/splitter as that used to make the plot of FIG. 5, but with an external impedance matching tuner for reducing the mismatch loss. As can be seen, the through loss at various frequencies can be improved by the use of tuning.

Figure 8:
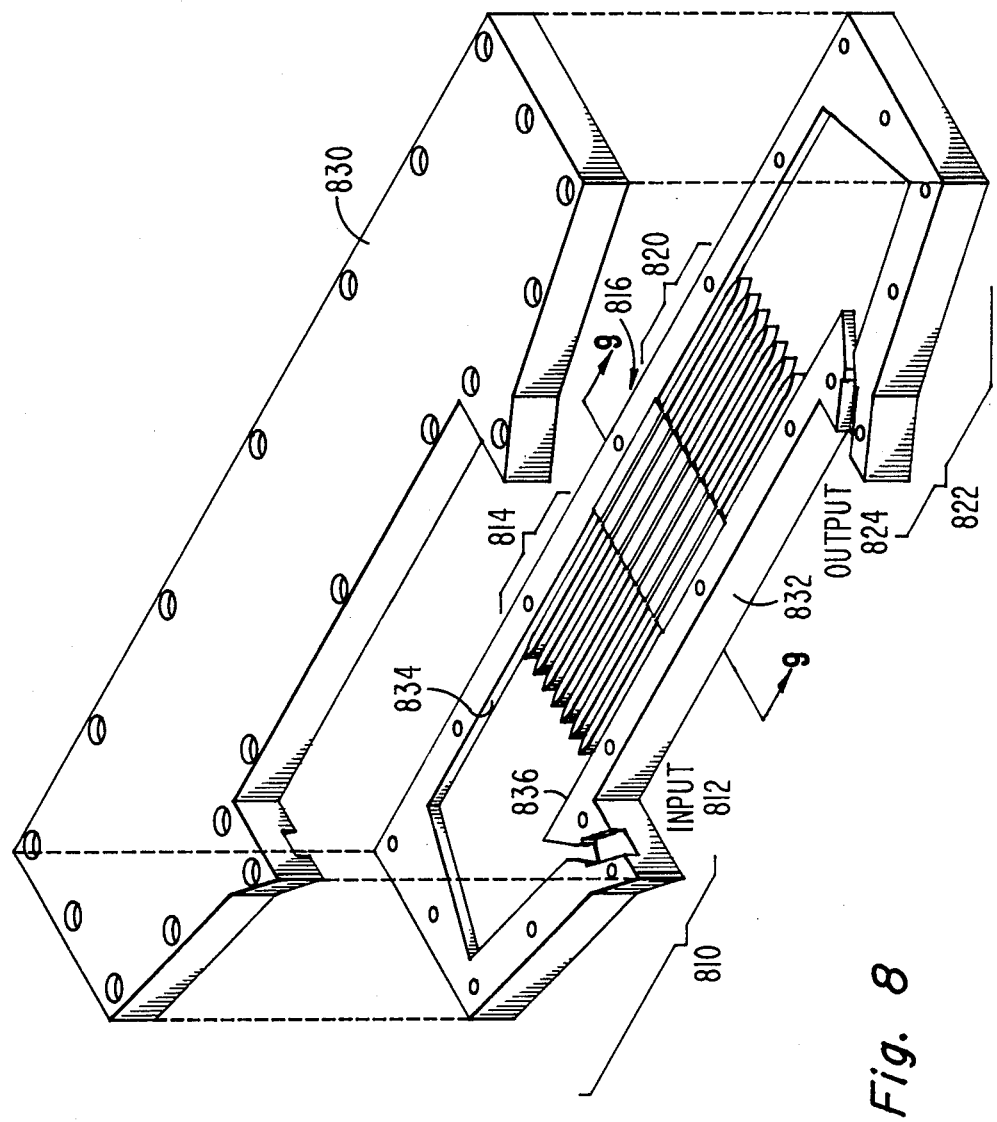
FIG. 8 illustrates an arrangement similar to that of FIG. 4 including an amplifier module located in each waveguide of the waveguide array.

FIG. 8 illustrates a pair of combiner/splitters arranged together with amplifier modules to form a power amplifier. In FIG. 8, a structure generally similar to that of FIG. 4 includes an input power splitter 810 arranged between an input port 812 and a waveguide array 817 associated with slot array 814. Each waveguide of array 817 is associated with an amplifier module of an amplifier module array 816, and each amplifier module of amplifier module array 816 produces an amplified output signal in its output waveguide. Each slot of an array of slots 820 is a portion of the waveguide array in which the amplified output signals appear. Slot array 820 is part of a power combiner 822 which produces an amplified signal at an output port 824.

Figure 9:
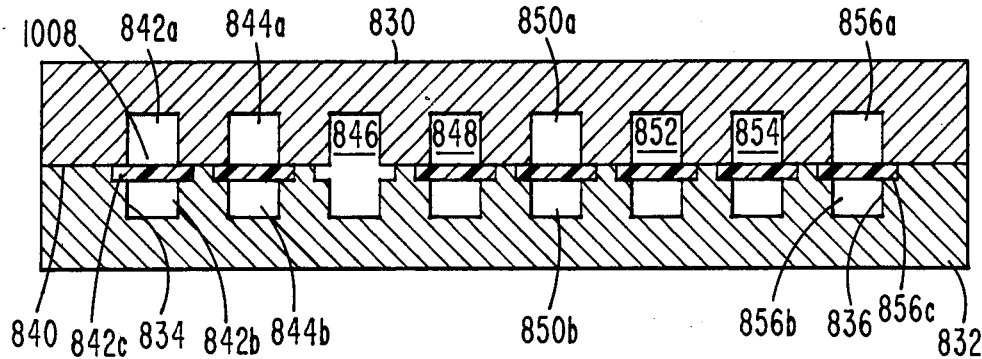
FIG. 9 is a cross-sectional view of the arrangement of FIG. 8 illustrating the support arrangements for the amplifier modules.

FIG. 9 is a cross section of the power amplifier of FIG. 8 in its assembled form taken along section line 9—9 of FIG. 8. Elements of FIG. 9 corresponding to those of FIG. 8 are designated by the same reference numeral. In FIG. 9, upper plate 830 and lower plate 832 are joined along a parting plane 840. A plurality of slots 842a, 844a . . . 856a formed in upper plate 830 and corresponding slots 842b . . . 856b formed in lower plate 832 define waveguides 842–856. A printed circuit board 842c–856c is centered within each waveguide 842–856. Each printed board is supported by a shoulder portion of the slot 842b–856b milled into lower plate 832. In order to illustrate the shape of the slot, waveguide 846 is illustrated without its associated printed circuit board 846c. Each printed circuit board 842c–856c is the largest constituent of an amplifier module.

Figure 10A:
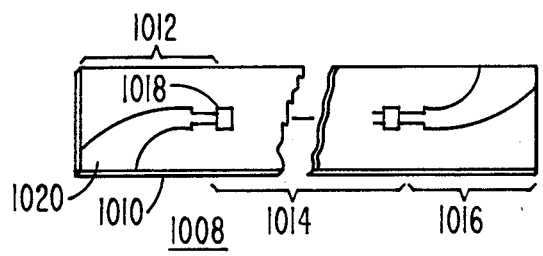
FIGS. 10a, 10b and 10c illustrate the matching structure printed on a printed circuit board of an amplifier module and its orientation in the waveguide.

The general form of each amplifier module 842c–856c is illustrated in FIG. 10a. In FIG. 10a, an amplifier module 1008 includes an elongated printed circuit board (or Duroid or Quartz substrate) 1010. Board 1010 includes a first portion 1012 on which is printed a conductive pattern which provides an impedance matched transition between a waveguide mode of propagation and a microstrip mode. The portion designated 1014 is a microstrip transmission region. The region designated as 1014 includes active amplification components (not illustrated). At the end of board 1010 remote from portion 1012 is a further portion 1016 which includes printed patterns defining a transition between the microstrip mode in region 1014 and the waveguide mode. The mode transition arrangements or baluns in regions 1012 and 1016 are of a type known as fin-line, and are described in the aforementioned Quine patent. Unlike the Quine arrangement, however, two such transitions are necessary in each amplifier module, one for the microstrip-to-waveguide transition at each end of amplifier module 1008. Microstrip portion 1014 of module 1008 may include printed or add-on circuit elements of the discrete or distributed type (not illustrated), as well known in the art, for amplifying the signals propagating in microstrip region 1014. As an example of an add-on discrete element, a block 1018 represents a chip capacitor for providing direct current (DC) isolation between conductor 1020 of transition 1012 and other elements of the module. Arrangements for DC powering of the amplifier modules are obvious and illustration is not necessary.

Figure 11A:
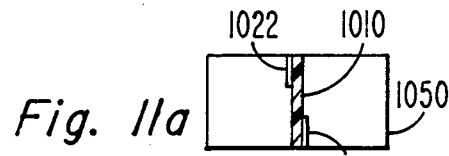
FIGS. 11a-11e are cross sections of the printed circuit board illustrated in FIG. 10b.
Figure 11B:
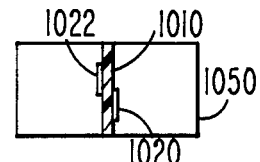
Figure 11C:
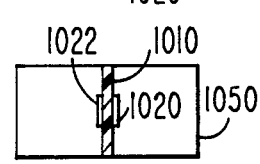
Figure 11D:
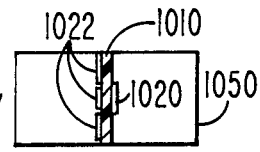
Figure 10B:
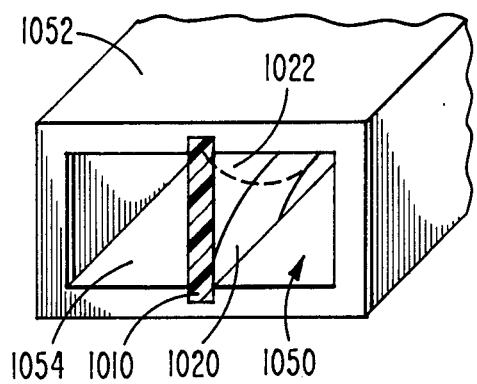
Figure 11E:
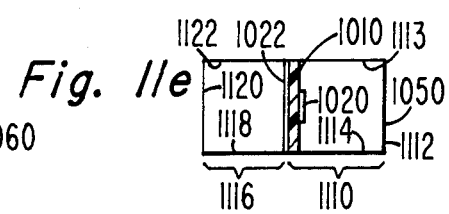
Figure 10C:
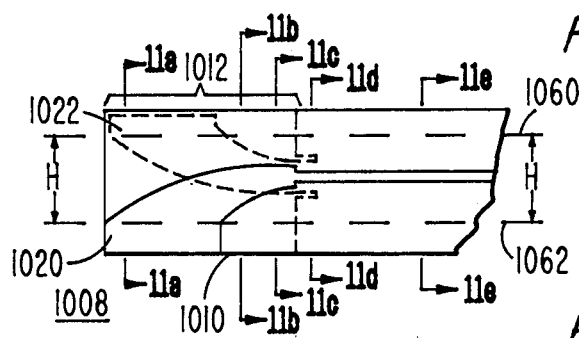

Since transition 1016 is similar to transition 1012, only transition 1012 is described in detail. FIG. 10b illustrates the orientation of an amplifier module 1008 within a waveguide 1050 having top and bottom walls 1052 an 1054, respectively, illustrating the location of a first portion 1020 of the conductive pattern forming part of transition 1012. In the interest of simplicity, a single waveguide 1050 is illustrated rather than an array as in FIG. 9. A second portion 1022 of the conductive pattern is on the side opposite board 1010 from portion 1020. Both conductive patterns 1020 and 1022 extend to the edge of board 1010 and are in conductive contact with walls 1054 and 1052, respectively. Details of the conductive pattern of transition 1012 are illustrated in FIG. 10c. In FIG. 10c, the pattern of conductive portion 1022 is illustrated by dotted lines, and its position relative to conductive pattern 1020 is clear. The portion of patterns 1020 and 1022 lying in the region H between lines 1060 and 1062 does not touch wall 1052 and 1054, while that portion of conductive pattern 1022 lying between line 1060 and the adjacent edge of board 1010 is in intimate contact with waveguide wall 1052, and that portion of conductive pattern 1020 lying between line 1062 and the adjacent edge of board 1010 is in intimate contact with wall 1054 of waveguide 1050. FIGS. 11a–11e are sections of amplifier modules 1008 taken at section lines a through e, respectively. As illustrated in FIG. 11a, conductive patterns 1020 and 1022 form what amounts to a conductive ridge within waveguide 1050 at the location of section line a. As is known, such a ridge tends to concentrate the electric field between the facing edges of conductive portions 1020 and 1022. FIG. 11b illustrates the condition at the position of section line b, at which position conductive portions 1020 and 1022 are separated from the walls of the waveguide, and are closer to each other than in the case of FIG. 11a. This tends to increase the capacitance between conductive portions 1020 and 1022 and decrease the electric field intensity by distributing the associated charge over a larger area near the center of printed circuit board 1010. FIG. 11c illustrates the form of conductors 1020 and 1022 at section line c, which essentially corresponds to a balanced two-conductor transmission line. The conductor pattern near section line d is illustrated in FIG. 11d. At this position, conductive portion 1022 is divided into three parts by a pair of slots which form a choke at the frequency of operation, which tends to isolate transition portion 1012 (FIG. 10a) from microstrip portion 1014 of the conductive pattern. Finally, FIG. 11e illustrates a microstrip shape at a typical section line e. As is well known in the art, the pattern illustrated in FIG. 11e is merely a prototype, which may be modified in known manner by addition of various amplifier active and passive components or elements.

Figure 12:
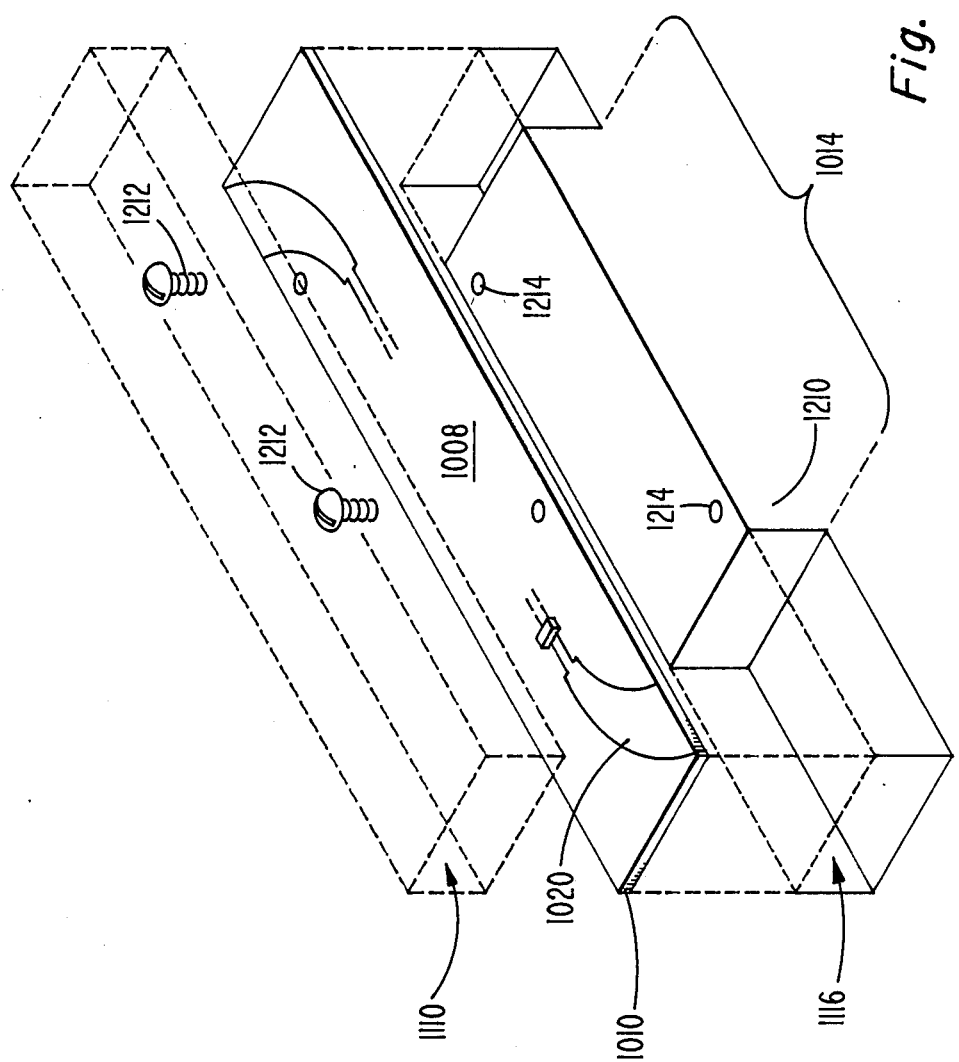
FIG. 12 illustrates the location of a heat sink in relation to the amplifier module.

It will often be desirable to provide a thermally conductive heat sink for the active elements (not illustrated) of each amplifier module 1008. This may be especially true when the power amplifier of which the amplifier modules are a part is used in an earth satellite, where it may be operated in a vacuum and therefore convection cooling is unavailable. Even if convection cooling is available, the closed nature of the waveguides may tend to reduce its effectiveness. Further, at the high frequencies of operation contemplated by the use of waveguides, active amplifying elements tend to be relatively inefficient in their conversion of direct power to radio frequency signal, and therefore tend to produce substantially more heat than the active elements of amplifiers operated at lower frequencies. It will be noted by examining FIG. 11e that the structure illustrated therein defines two rectangular portions or closed tubes completely surrounded by conductor. A first closed tube 1110 is defined by walls 1112, 1113 and 1114 of waveguide 1050 and by conductive portion 1022. A second closed tube 1116 is bounded by conductive walls 1118, 1120 and 1122 of waveguide 1050 and by conductive surface 1022. Balun portion 1012 of FIG. 10a is intended to transfer the signal to be amplified into conductive tube 1110, where it is carried by microstrip conductor 1020. There may be some signal passing through portion 1116 due to imperfections in the balun. These dual paths for the flow of signal are undesirable, because the the main signal path through region 1110 will experience delays associated with the amplifier as well as amplification, and these delays will result in a phase difference between the two signals when they are recombined by output balun 1016. This is especially undesirable at high frequencies, because the amplification of the amplifier module tends to be greater at lower frequencies, whereby the signal added by way of tube 1116 may be of significant amplitude by comparison with amplified signal. The addition of a phase-shifted signal may reduce the effective amplification of the amplifier module. Both the problem of preventing the flow of signal through portion 1116 and the problem of providing conductive heat sinking is solved as illustrated in FIG. 12 by a conductive block 1210 added within portion 1116 of the waveguide at locations within portion 1014 of the module in which the active elements of the amplifier module are located. Block 1210 may be added separately or may be milled as part of a top or bottom plate. Block 1012 also provides a firm support to which board 1010 of amplifier module 1008 may be affixed by screws 1212 threaded into holes 1214 in block 1012. Heat transfer between board 1010 and block 1012 may be improved by use of a thermally conductive grease (not illustrated) at the interface.

Other embodiments of the invention will be apparent to those skilled in the art. For example, each half of the power combiner/splitter may be assembled rather than milled from solid stock. There may be more or less than eight waveguides in array 116 (FIG. 1). It is not necessary for conductive block 1210 (FIG. 12) to completely fill the associated waveguide portion in order to block passage of signal and to provide heat-sinking. It is sufficient if a substantial short-circuit occurs across the waveguide portion, and a low thermal conductivity path is provided between the active element (transistor, etc.) and the main body of the amplifier. The illustrated embodiments have the input and output waveguides of the waveguide arrays arranged coaxially. However, waveguides of the arrays may be curved to produce a nonplanar structure, if desired. While phase correction is not necessary for differing line lengths between the common waveguide port and each amplifier module, it may be desirable to provide phase correction to correct for differences in phase response of the various amplifier modules, which will ordinarily be accomplished in the individual amplifier module. The unit spacing of the waveguides of the waveguide array or arrays may be outside the range of $\lambda/2$ to $\lambda$.

What is claimed is:
1. A waveguide combiner/divider, comprising:
a conductive reflector having a focal point;
a waveguide feed located at said focal point and adapted for illuminating said reflector;
a plurality of waveguides each including an aperture, said apertures of said waveguides being arrayed before said reflector for transferring electromagnetic energy between said waveguide feed and said plurality of waveguides by way of said reflector; and
conductive shielding and support means coupled to said conductive reflector, to said waveguide feed and to said plurality of waveguides, said conductive shielding and support means, together with said conductive reflector, said waveguide feed and said plurality of waveguides defining a closed region for constraining the flow of said electromagnetic energy to said waveguide feed, said plurality of waveguides, and to a region between said reflector, said waveguide feed and said plurality of waveguides.

2. A combiner/divider according to claim 1, wherein said plurality of waveguides is arrayed with center lines lying in a plane whereby said apertures of said waveguide form a line array.

3. A combiner/divider according to claim 1, wherein each of the waveguides of said plurality of waveguides is rectangular so as to define broad walls and narrow walls, said plurality of waveguides being arrayed with center lines lying in a plane and with contiguous broad walls, whereby said apertures of said plurality of waveguides define a line array in the direction of the E-fields.

4. A combiner/divider according to claim 3 wherein said line array is oriented relative to said reflector in such a manner that each of said apertures of said plurality of waveguides is at a point which is an equal distance from said focal point by way of reflection from said reflector whereby the phase of said electromagnetic energy at corresponding points in each of said plurality of waveguides is the same.

5. A combiner/divider according to claim 3 wherein said broad walls near said apertures have thickness which tapers from full thickness to zero.

6. A combiner/divider according to claim 3 wherein said line array has a unit spacing of said apertures ranging from one half wavelength to one wavelength at the frequency of operation.

7. A waveguide power combiner/divider, comprising:
a feed waveguide including parallel narrow walls spaced apart by parallel broad walls;
a pair of conductive wall extensions spaced apart by a distance equal to the distance by which said narrow walls of said feed waveguide are spaced apart, and connected to said narrow walls to form extensions thereof;
a conductive reflector oriented before said feed waveguide and between said pair of wall extensions, said reflector having a focus located within said feed waveguide;
a plurality of substantially flat mutually parallel conductive septums oriented between and orthogonal to said wall extension, said plurality of septums defining a further plurality of waveguide apertures arranged in a line array, and an associated waveguide associated with each of said apertures, said line array of waveguide apertures being oriented before said reflector.

8. A combiner/divider according to claim 7 wherein each of said conductive septums has a thickness selected to space apart each of said apertures arranged in a line array by a distance selected to provide a unit spacing of from one half wavelength to one wavelength at the frequency of operation.

9. A combiner/divider according to claim 7 wherein said reflector has a parabolic surface, and said line array is oriented relative to said reflector so as to produce constant phase at said line array when said reflector is driven from said focal point.

10. A combiner/divider according to claim 7 wherein the spacing between said narrow walls and between said conductive wall extensions is approximately one half wavelength at the frequency of operation.

11. An amplifier, comprising:
a pair of flat, parallel, spaced-apart conductive side walls;
a number of substantially flat elongated mutually parallel conductive septums oriented between and orthogonal to said pair of side walls, said septums defining a plurality of waveguides having parallel axes, and also defining at least one line array of waveguide ports associated with said waveguides;
a plurality of amplifier modules equal to said plurality, each of said amplifier modules being located in one of said plurality of waveguides for amplifying signal passing therethrough;
a pair of conductive ancillary walls located between and orthogonal to said conductive walls, said ancillary walls being mutually parallel and defining in conjuction with said pair of side walls a common waveguide through which the signal from each of said plurality of waveguides flows in common and also defining a common waveguide port, the axis of said common waveguide being at an angle relative to said parallel axes; and
a reflector having at least one focus located near said common waveguide port for reflecting energy passing between said common waveguide port and said line array of waveguide ports.

12. An amplifier according to claim 11 wherein the spacing between said conductive side walls is one half wavelength at the frequency of operation.

13. An amplifier according to claim 11 wherein said second plurality of waveguides defines a second line array of ports, and said amplifier further comprises a second common waveguide port and a second reflector having a focus near said second common waveguide port for reflecting energy flowing between said second common waveguide ports and said second line array of ports.

14. An arrangement according to claim 11 wherein the unit spacing between ports of said line array of waveguide ports is in the range of one half wavelength to one wavelength at the frequency of operation.

15. An arrangement according to claim 11 wherein the thickness of each of said plurality of septums tapers to zero near said line array of waveguide ports.

16. An arrangement according to claim 11 wherein said reflector has the shape of a portion of a parabola, said parabola having an axis, and said line array of waveguide ports is centered on a line perpendicular to said axis of said parabola for producing a wavefront of equal phase of said line array of waveguide ports.

* * * * *